(12) United States Patent
Sheffield

(10) Patent No.: US 7,636,243 B2
(45) Date of Patent: Dec. 22, 2009

(54) METHODS AND APPARATUS FOR A BOARD ASSEMBLY

(75) Inventor: Gregory L. Sheffield, O'Fallon, MO (US)

(73) Assignee: The Boeing Company, Chicago, IL (US)

(*) Notice: Subject to any disclaimer, the term of this patent is extended or adjusted under 35 U.S.C. 154(b) by 315 days.

(21) Appl. No.: 11/301,705

(22) Filed: Dec. 13, 2005

(65) Prior Publication Data

US 2007/0133186 A1 Jun. 14, 2007

(51) Int. Cl.
*H01R 12/16* (2006.01)
(52) U.S. Cl. ................................ 361/788; 361/796
(58) Field of Classification Search ............... 361/788, 361/760, 741, 730, 748, 736, 720; 710/82, 710/301, 305
See application file for complete search history.

(56) References Cited

U.S. PATENT DOCUMENTS

| | | | | | |
|---|---|---|---|---|---|
| 4,063,220 | A | * | 12/1977 | Metcalfe et al. | 370/462 |
| 5,273,463 | A | * | 12/1993 | Kaetsu et al. | 439/681 |
| 5,448,699 | A | * | 9/1995 | Goss et al. | 710/301 |
| 5,576,935 | A | * | 11/1996 | Freer et al. | 361/785 |
| 5,578,203 | A | * | 11/1996 | Ford et al. | 210/167.04 |
| 5,802,558 | A | * | 9/1998 | Pierce | 711/115 |
| 5,827,074 | A | * | 10/1998 | Gatti | 439/61 |
| 6,328,598 | B1 | * | 12/2001 | Harris, Jr. | 439/516 |
| 6,625,033 | B1 | * | 9/2003 | Steinman | 361/753 |
| 6,789,148 | B1 | * | 9/2004 | Hinds | 710/300 |
| 6,801,769 | B1 | * | 10/2004 | Royalty | 455/431 |
| 7,149,093 | B2 | * | 12/2006 | Conway | 361/788 |
| 7,281,076 | B2 | * | 10/2007 | Yates et al. | 710/305 |
| 2001/0033475 | A1 | * | 10/2001 | Lillios et al. | 361/687 |
| 2006/0282823 | A1 | * | 12/2006 | Li et al. | 717/121 |

* cited by examiner

*Primary Examiner*—Hung S Bui
(74) *Attorney, Agent, or Firm*—Yee & Associates, P.C.; Baldwin D. Quan

(57) ABSTRACT

A re-usable adapter card interfaces with a first card such that components requiring a lower certification level—e.g., commercial off-the-shelf (COTS) components or the like—may be isolated on the first card, wherein the adapter card includes high certification-level parts and communicates with the first card. The two cards are electronically and mechanically coupled to form the finished board assembly. The interface card may be re-used in a variety of current or future cabinet specifications, including, for example, cabinets manufactured in accordance with the Compact PCI (cPCI) 3U and 6U specifications.

20 Claims, 4 Drawing Sheets

METHODS AND APPARATUS FOR A BOARD ASSEMBLY

TECHNICAL FIELD

The present invention generally relates to peripheral interface boards and, more particularly, to re-usable adapter cards and assemblies.

BACKGROUND

Interface boards used in connection with commercial and government systems must typically conform to one or more standards and/or specifications. These guidelines not only specify the size and shape (i.e., "form factor") of the board for a particular cabinet or other enclosure, but also set forth power requirements, communication protocols, safety standards, and the like.

It is often the case that boards developed in accordance with one standard cannot later be used in applications conforming to subsequent standards. Conversely, a board developed according to a later standard may not be backward-compatible with prior cabinets and systems. The need to constantly update boards in order to adhere to changing standards gives rise to significant costs.

Furthermore, the components included on such boards (and/or the software incorporated into those components) may require extensive testing and/or must conform to strict design rules in order to meet applicable safety standards. As a result, original equipment manufacturers (OEMs), integrators, and resellers have increasingly turned to designing and building cost-effective solutions using commercial off-the-shelf (COTS) components. Such COTS components (or collections of components) are typically less expensive than equivalent custom-built components; however, since COTS components are typically integrated with non-COTS components on the same board, the cost-savings associated with using COTS components is significantly reduced because the entire system (i.e., the board itself) must still be tested to the higher level of certification.

Accordingly, it is desirable to develop systems and methods for allowing board components to be used in subsequent cabinets while still being backward-compatible with legacy systems. Furthermore, it would be desirable to isolate components used in boards in order to reduce certification costs.

BRIEF SUMMARY

The invention may be embodied in one form by a first card and a re-usable adapter card that interfaces with the first card such that components requiring a lower certification level—e.g., commercial off-the-shelf (COTS) components—may be isolated on the first card, wherein the adapter card includes higher certification-level parts and communicates with the first card. The two cards are electronically and mechanically coupled to form the finished board assembly; however, the interface card may be re-used in a variety of current or future cabinet specifications, including, for example, cabinets manufactured in accordance with the Compact PCI (cPCI) 3U and 6U specifications.

BRIEF DESCRIPTION OF THE DRAWINGS

The present invention will hereinafter be described in conjunction with the following drawing figures, wherein like numerals denote like elements.

DETAILED DESCRIPTION

Figure 1:
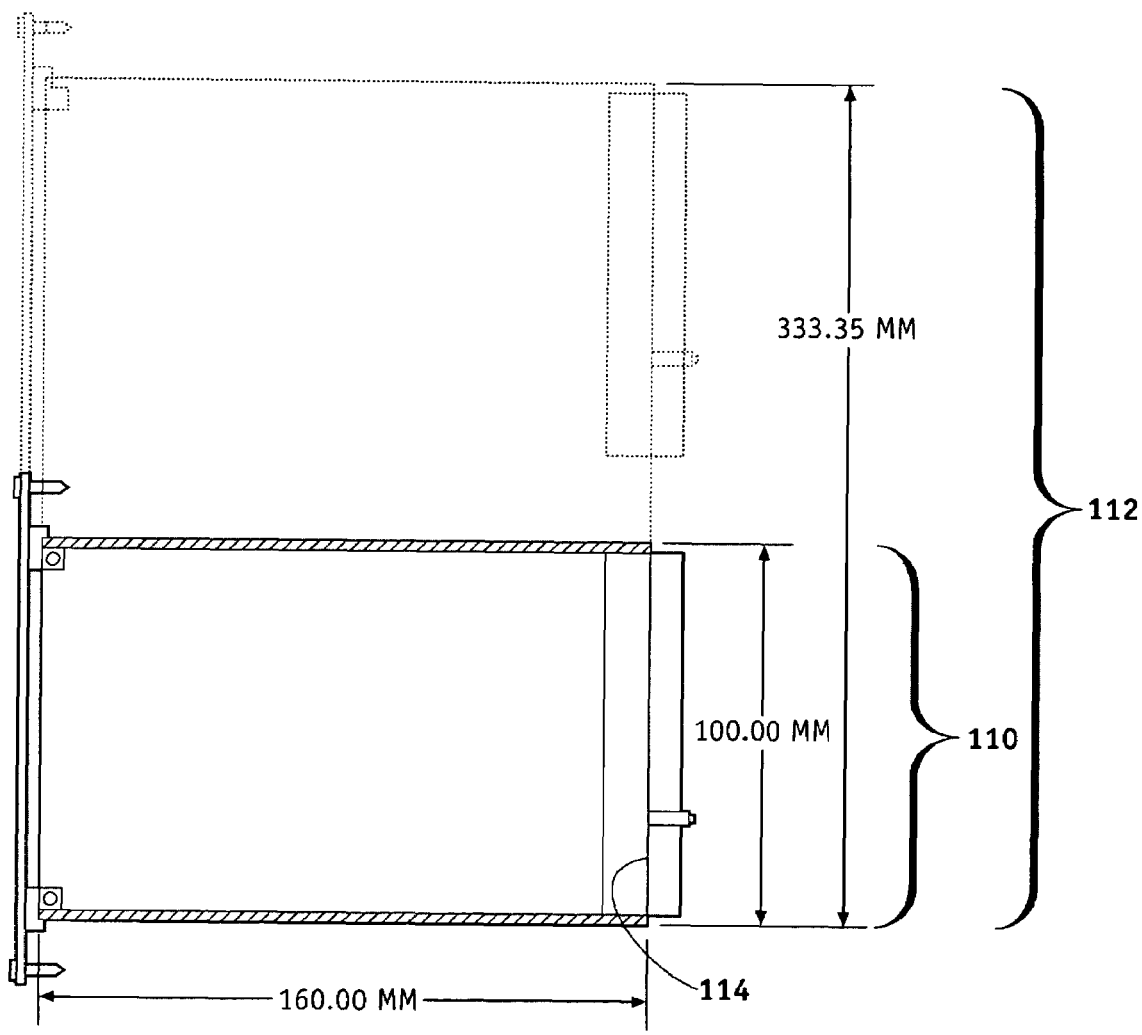
FIG. 1 is a side view showing dimensional differences between cPCI 6U and 3U modules.

The following detailed description is merely exemplary in nature and is not intended to limit the invention or the application and uses of the invention. Furthermore, there is no intention to be bound by any expressed or implied theory presented in the preceding technical field, background, brief summary or the following detailed description.

The invention may be described herein in terms of functional and/or logical block components and various processing steps. It should be appreciated that such block components may be realized by any number of hardware, software, and/or firmware components configured to perform the specified functions. For example, an embodiment of the invention may employ various integrated circuit components, e.g., memory elements, digital signal processing elements, logic elements, look-up tables, or the like, which may carry out a variety of functions under the control of one or more microprocessors or other control devices. In addition, those skilled in the art will appreciate that the present invention may be practiced in conjunction with any number of data transmission protocols and that the system described herein is merely one exemplary application for the invention.

For the sake of brevity, conventional techniques related to signal processing, data transmission, signaling, network control, and other functional aspects of the systems (and the individual operating components of the systems) may not be described in detail herein. Furthermore, the connecting lines shown in the various figures contained herein are intended to represent example functional relationships and/or physical couplings between the various elements. It should be noted that many alternative or additional functional relationships or physical connections may be present in a practical embodiment.

In general, the present invention relates to a re-usable adapter card that interfaces with another card such that components requiring a lower certification level—e.g., commercial off-the-shelf (COTS) components or the like—are isolated on the first card, and components requiring a higher certification level are attached to the adapter card. The two cards are electronically and mechanically coupled to form the finished board assembly whose size is selected such that it may fit within a variety of current or future cabinet specifications.

One such specification is the Compact Peripheral Component Interface (cPCI) specification, which is adapted from the Peripheral Component Interface (PCI) standard used in industrial computer application, but uses a smaller, VME (VersaModule-Eurocard) format. Detailed information regarding this specification can be found, for example, in PICMG 2.0 Rev 3.0 CompactPCI Core Specification and PICMG 2.1-2.20, published by the PCI Industrial Computer Manufacturer's Group (PICMG). The cPCI products allow original equipment manufacturers (OEMs), integrators, and resellers to design and build cost-effective solutions using commercial, off-the-shelf (COTS) components.

There are two card sizes or "form factors" supported by cPCI, as shown in FIG. 1: A "3U" card 110 that is 100 mm×160 mm and has a single 220-pin connector, and a "6U" card 112 that is 233 mm×160 mm and can support up to three additional connectors. In each case, the card-side connector is male (right-angle), and the backplane side (114) is female (straight). The boards are designed from front-loading and removal. Boards are mounted vertically to enhancing heat transfer. In general, cPCI supports a 32- or 64-bit synchronous data bus, a 32-bit address bus, and a 133 or 266 MBytes/s data transfer rate.

Figure 2:
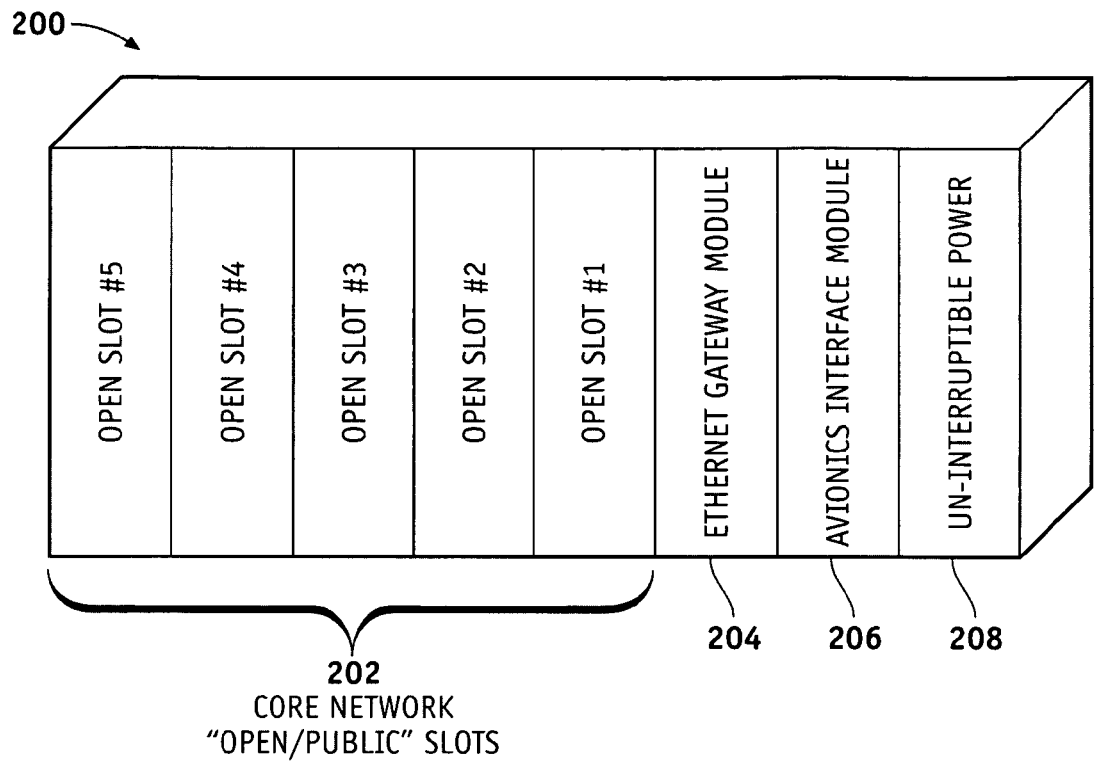
FIG. 2 is a schematic overview of a core network cabinet showing allocation of slots.

A system in accordance with the cPCI specification supports up to eight-slot backplanes. FIG. 2 shows a exemplary core network 8-slot cabinet 200 of the type having 6U-based dimensions. In accordance with this configuration, there are five open slots 202 (#1-#5), an Ethernet module 204, an avionics interface module (AIM) 206, and an un-interruptible power supply 208. The five open slots 202 are generally filled by five corresponding 6U boards. Low-profile boards (e.g., 3U boards) are generally not configured to fit within these open slots, reducing the utility of the cabinet as new board specifications are developed.

Figure 3:
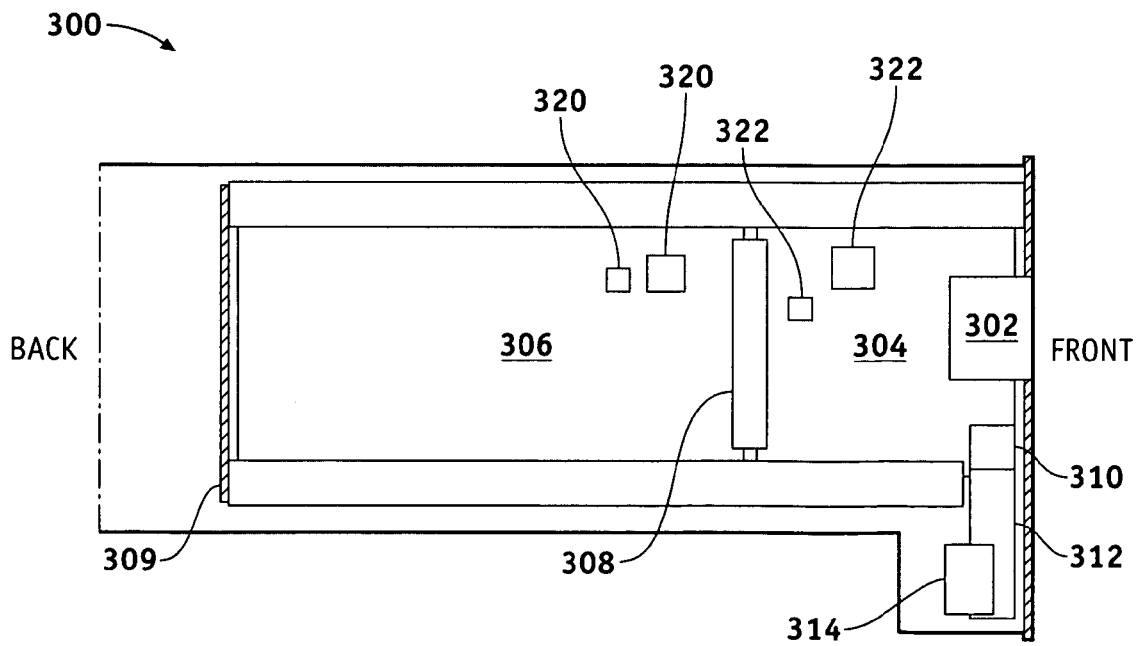
FIG. 3 an overview of a module in accordance with one embodiment of the present invention.

Referring now to FIG. 3, an assembly 300 in accordance with one embodiment of the present invention generally includes a card 306, an adapter card 304 electrically and mechanically connected to card 306 via connector 308 at one end (i.e., the right end in FIG. 3), an optional external connector 302, and an extender card 312 coupled to functional blocks 310 and 314, described in further detail below. Board 304 includes one or more electronic components 322, and board 306 similarly includes one or more electronic components 320. One end (309) of card 306 is configured to interface with a backplane of a cabinet (not shown).

Adapter card 304 communicates with components 320 on card 306 as well as any external interfaces, including, for example, any backplane to which side 309 is ultimately connected. In accordance with one aspect of the present invention, components 320 on board 306 and/or the entire board 306 conform to a certification level that is lower than that of adapter board 304 (and/or components 322). For example, board 306 may be populated entirely by COTS components, while board 304 is populated by components that conform to a higher certification level.

In this regard, the term "certification" as used herein refers to any set of guidelines or standards, developed by a certification authority, to which a component or system must comply in order to be considered as conforming to that certification designation. The terms "higher" or "lower" as used with respect to a level of certification refers to the relative difficulty in achieving that certification designation. A certification level may be considered more difficult to obtain, for example, if it includes additional criterion, more restrictive criterion, more stringent testing, or a combination thereof.

The DO-178 requirements promulgated by the Radio Technical Commission for Avionics (RTCA), for example, provide for a number of different aircraft-related certification levels for software/hardware systems. The ED-35 standard developed by the European organization for Civil Aviation Equipment (EUROCAE) is another such standard. In the DO-178 standard, five different levels are defined depending upon what would occur in the event of failure, e.g.: Level E (the lowest level, where failure would have no effect on an aircraft), Level D (causing or contributing to a minor failure condition), Level C (causing or contributing to a major failure condition), Level B (causing or contributing to hazardous/severe major failure condition), and Level A (the highest level, where failure of the component or software would result in a catastrophic failure condition).

Referring again to FIG. 3, connector 308 (which may be physically integrated into one or both of cards 304 and 306) allows adapter card 304 to be removeably attached to card 306. In this regard, connector 308 includes electronic contacts and signal routing hardware suitable to provide electrical connectivity as well as mechanical connectivity. The dimensions of first board 306 and second board 304 (as well as connector 308) may be selected such that the combined length and height of assembly 300 conforms with any particular standard (e.g., the cPCI 3U standard).

Extender card 312 may include or interface with circuitry within functional blocks 310 and 314. These functional blocks relate to inter-cabinet communications and external communications described further below in conjunction with FIG. 5, wherein block 310 corresponds to block 534, and block 314 is any interface capable of facilitating communication between card 304 and various external and/or internal components.

Figure 4:
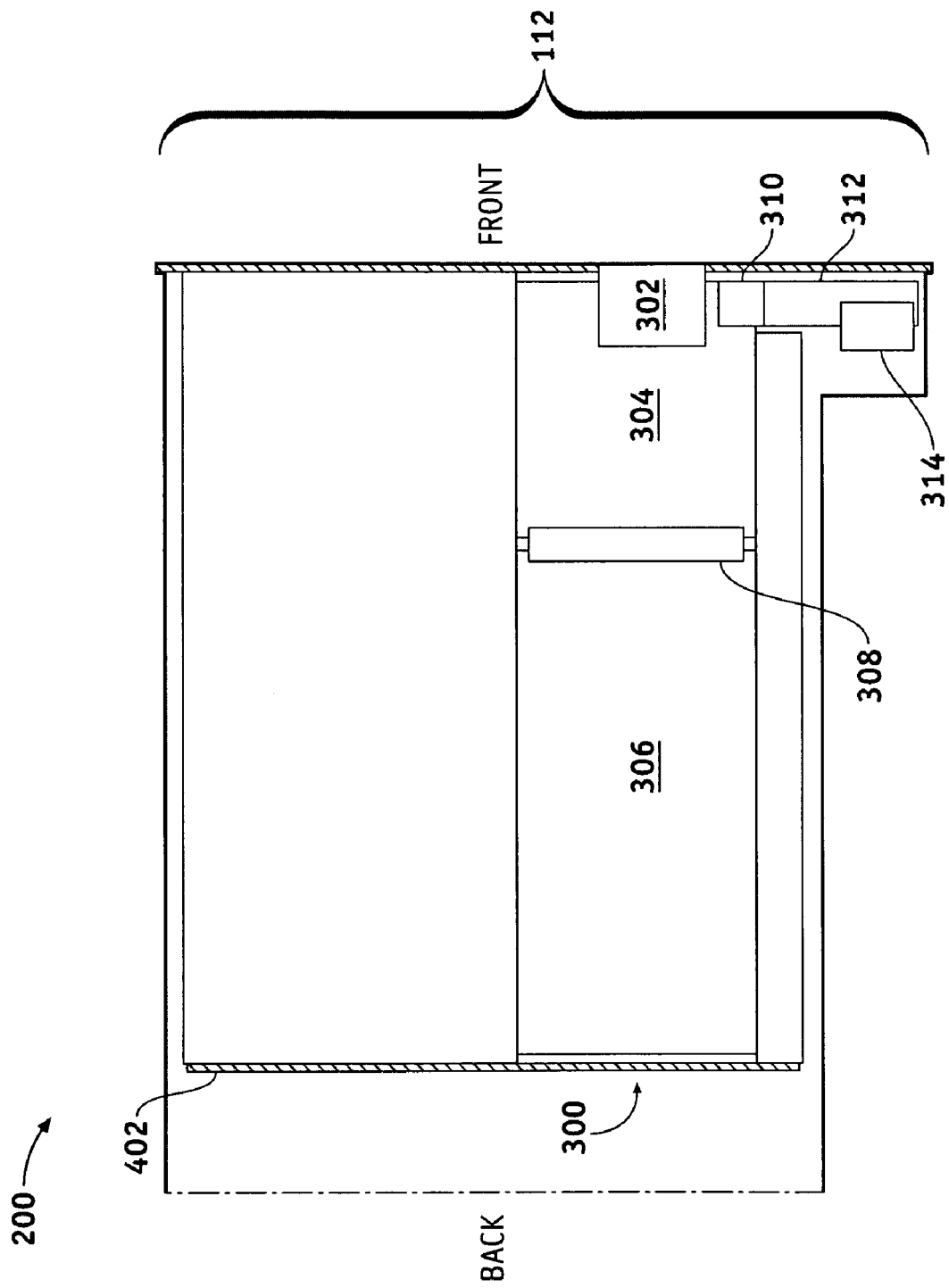
FIG. 4 is an overview of the module of FIG. 3 inserted into a 6U cabinet.

In accordance with another aspect of the present invention, adapter card 304 allows for backward-compatibility with prior cabinet designs. FIG. 4, for example, shows the assembly of FIG. 3 as inserted into a 6U cabinet of the type illustrated in FIG. 2. As shown, approximately half of cabinet 200 is taken up with assembly 300 as configured with adapter card 304. An empty portion 402 remains, allowing another 3U assembly to be inserted if desired. In this way, the 6U cabinet can be used to house approximately twice as many boards.

Figure 5:
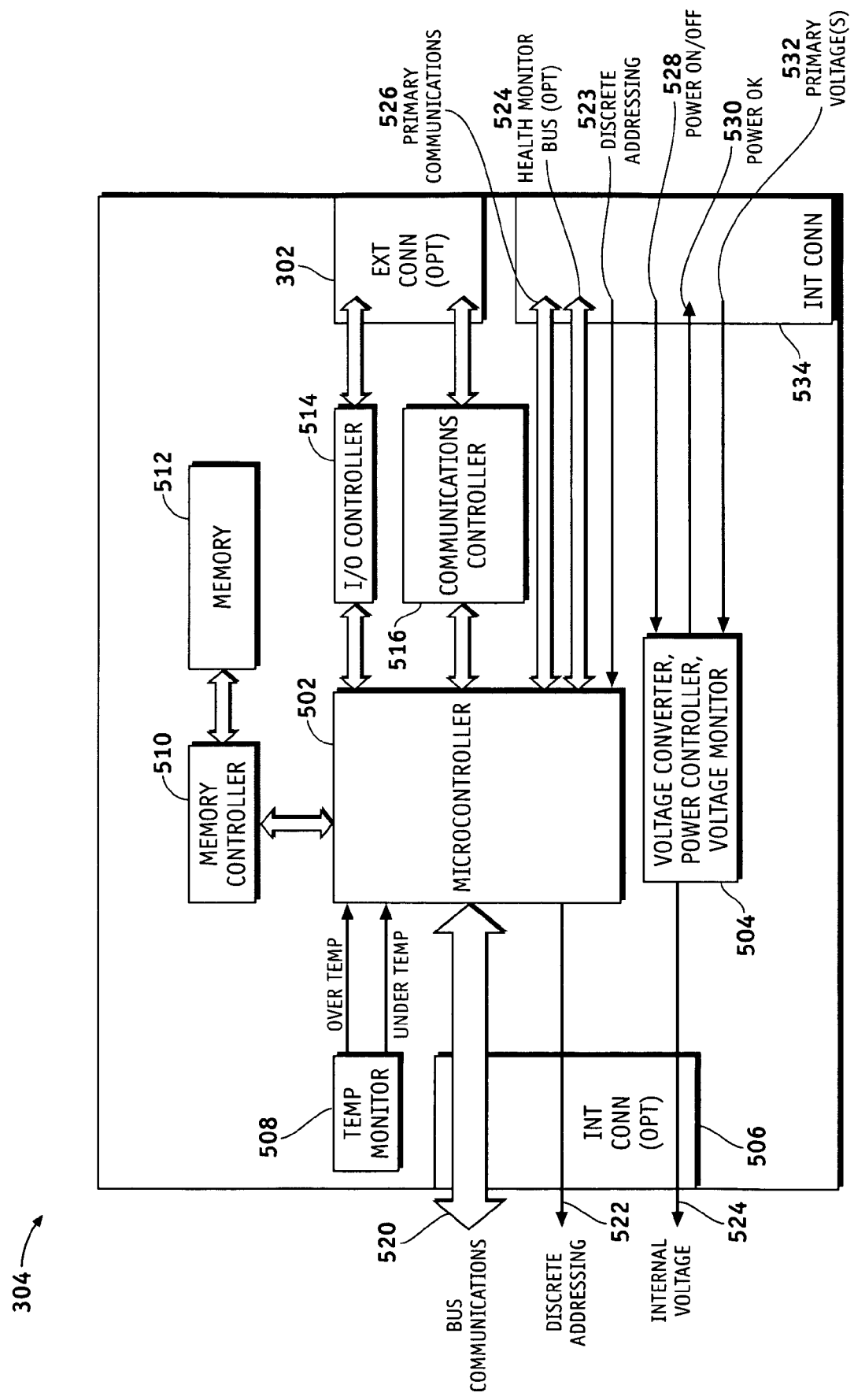
FIG. 5 is a functional block diagram of an adapter card in accordance with one embodiment of the present invention.

FIG. 5 shows a functional block diagram of an exemplary adapter card 304. In this embodiment, adapter card 304 generally includes a microcontroller (or other suitable processor) 502, a memory controller 510, memory 512, I/O controller 514, communications controller 516, external connector 302, internal connector 534, power module 514, temperature monitor 508, and optional internal connector 506.

Temperature controller 508 measures the temperature of board 304 and/or its environment using any convenient technique (e.g., a thermocouple, an on-board diode, etc.) and reports over-temperature and under-temperature conditions to microcontroller 502. Microcontroller 502 may then use this information for health reporting or the like.

I/O controller controls input and output between external connector 302 and microcontroller 502. Similarly, communications controller 516 controls wireless and/or wired communication from and to microcontroller 502. In this regard, external connector 302 is an optional component that may be used in applications where additional input and output to board 304 is required.

Power module 504 interfaces with an outside power supply and support electronics (not shown) through internal connector 534, receiving a primary voltage 532 and a power on/off state 528, and outputting a "power OK" status 530 as appropriate. In this regard, power module 504 preferably includes a voltage converter, a power controller, and a voltage monitor as known in the art. Power module 504 also supplies an internal voltage 524 through internal connector 1506 to the 3U card (item 306 in FIG. 3).

Microcontroller 502 controls all the functions of adapter card 302 as outlined above. Furthermore, microcontroller 502 communicates with the outside world through internal connector 534 with respect to primary communications 526, health monitor bus 524, and discrete addressing 523. Microcontroller 502 preferably implements whatever protocols, signals, and addressing required by the standards to which it is conforming. In a cPCI 3U application, for example, Microcontroller 502 would use the various busses and discrete addressing lines to conform to the 3U specification while sending and receiving signals to the components resident on board 306.

The adapter card microcontroller 502 may utilize health monitor bus 524 to send a "health OK" message periodically to a cabinet health monitoring microcontroller. The cabinet health monitoring microcontroller would then send an acknowledgment of the received "health OK" message back to adapter card microcontroller 502. The health monitor also conveniently receives reset and shutdown commands from the cabinet health monitoring microcontroller.

Microcontroller 502 handles discrete addressing 522 and bus communications 520 to card 306 via internal connector 506. Memory controller 510 communicates with memory block 512 (e.g., a volatile or non-volatile memory component) as well as microcontroller 502 in order to control memory access. While the term "microcontroller" is used to refer to component (or components) 502, it should be understood this term is not meant as a limitation, and that any combination of hardware, software, and/or firmware may be employed for this purpose. The operation of conventional microcontrollers, memories, I/O controllers, and bus communications is known in the art, and therefore need not be described in further detail.

Adapter card 304 is reusable in that it may be coupled to one type of board initially, then disconnected from that board to be used in a subsequent application. Microcontroller 502 may implement software code that is specific to the first card, then reprogrammed to handle operation of a second card at a later date. Because adapter card 304 handles (via bus 520), all major communication to the backplane, to optional external I/O, etc., it may be programmed to work with a variety of components and systems.

As mentioned above, components (including software) that conform to a high level of certification may be isolated to one card (the "second card") corresponding to adapter card 304 while lower level components are included on another card (the "first card") corresponding to card 306. In this way, the most expensive and labor-intensive components are re-used for a variety of applications (including future cabinet designs) without requiring re-certification of that board. This lowers recurring costs, reduces development time, simplifies technology upgrades, and allows backward and forward compatibility with a variety of cabinet designs.

It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing the exemplary embodiment or exemplary embodiments. It should be understood that various changes can be made in the function and arrangement of elements without departing from the scope of the invention as set forth in the appended claims and the legal equivalents thereof.

What is claimed is:

1. A board assembly for a backplane, said board assembly comprising:
a first card having a first end and a second end, wherein the first end interfaces with the backplane, and wherein the first card comprises a first set of components conforming to a first certification level; and
a second card attached, mechanically and electrically, to the second end, wherein the second card is in communication with the first card and, only directly through the first card, with the backplane, wherein the second card comprises a second set of components conforming to a second certification level that is higher than the first certification level, and wherein the first set of components is isolated from the second set of components.

2. The board assembly of claim 1, wherein the first certification level comprises a commercial off-the-shelf level.

3. The board assembly of claim 1, wherein the second card further comprises an extender card.

4. The board assembly of claim 1, wherein the first card and the second card, when coupled, have a combined length of about 160 mm, and a combined height of about 100 mm.

5. The board assembly of claim 1, wherein the second board further comprises an external connector.

6. The board assembly of claim 1, wherein the second board further comprises a memory and a microcontroller, wherein the memory contains a set of instructions that, when executed by the microcontroller, achieves communication with the first card and the backplane.

7. The board assembly of claim 6, wherein the second board further comprises a temperature monitor in communication with the microcontroller.

8. The board assembly of claim 6, further comprising a health monitor bus, and wherein the set of instructions, when executed by the microcontroller, further provides health information via the health monitor bus.

9. The board assembly of claim 1, wherein communication with the first card and the backplane is accomplished via bus communications and discrete addressing.

10. The board assembly of claim 1, wherein the second board further comprises a voltage converter, a power controller, and a voltage monitor.

11. The board assembly of claim 1, wherein the second card is removably attached to the second end.

12. A method of producing a board assembly, the method comprising the steps of:
attaching a first card to a backplane via a first interface;
attaching a second card, mechanically and electrically, to the first card via a second interface, wherein the second card is in communication with the first card and, and only directly through the first card, with the backplane;
attaching a first set of components to the first card, wherein the first set of components require conformance to a first certification level; and
attaching a second set of components to the second card, wherein the second set of components require conformance to a second certification level, wherein the second certification level is higher than the first certification level, and wherein the first set of components is isolated from the second set of components.

13. The method of claim 12, wherein the first certification level comprises a commercial off-the-shelf certification level.

14. The method of claim 12, wherein the first card and the second card, when coupled, have a combined length of about 160 mm, and a combined height of about 100 mm.

15. The method of claim 12, wherein attaching the second card to the first card comprises removably attaching the second card to the first card.

16. The method of claim 15, further comprising:
removing the second card from the first card;
attaching a third card to the first card, such that the third card is in communication with the first card and with the backplane, wherein the third card comprises a third set of components conforming to a third certification level that is higher than the first certification level, and wherein the first set of components is isolated from the third set of components.

17. An interface card comprising:
a first card comprising a first set of components conforming to a first certification level, wherein the first card further comprises a first end and a second end, wherein the first end comprises a structure that can interface with a backplane of a cabinet;

a second card attached, mechanically and electrically, to the second end, wherein the second card is in communication with the first card and, and only directly through the first card, with the backplane, wherein the second card comprises a second set of components conforming to a second certification level that is higher than the first certification level, and wherein the first set of components is isolated from the second set of components; and a controller interfacing, via a communication bus, with the second card and with the backplane.

18. The interface card of claim 17, wherein the interface card has a length of about 160 mm, and a height of about 100 mm.

19. The interface card of claim 17, wherein the first certification level comprises a commercial off-the-shelf level.

20. The interface card of claim 17, wherein the second card is removably attached to the second end.

* * * * *

UNITED STATES PATENT AND TRADEMARK OFFICE
CERTIFICATE OF CORRECTION

PATENT NO. : 7,636,243 B2
APPLICATION NO. : 11/301705
DATED : December 22, 2009
INVENTOR(S) : Gregory L. Sheffield Page 1 of 1

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 425 days.

Signed and Sealed this

Ninth Day of November, 2010

David J. Kappos
*Director of the United States Patent and Trademark Office*